US009964607B1

(12) United States Patent
Propes et al.

(10) Patent No.: US 9,964,607 B1
(45) Date of Patent: May 8, 2018

(54) RECOGNIZING AND IDENTIFYING DEFECT PATTERNS ON MAGNETIC MEDIA

(71) Applicant: Seagate Technology LLC, Cupertino, CA (US)

(72) Inventors: Nicholas C. Propes, Waconia, MN (US); Ryan Baldini, Longmont, CO (US); Rommel Liwag, Fremont, CA (US); Arswendo Tjahjadi, San Jose, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days. days.

(21) Appl. No.: 15/687,894

(22) Filed: Aug. 28, 2017

(51) Int. Cl.
  *G11B 27/36* (2006.01)
  *G01R 33/12* (2006.01)
  *G06K 9/00* (2006.01)
  *G06N 99/00* (2010.01)

(52) U.S. Cl.
  CPC .......... *G01R 33/1207* (2013.01); *G11B 27/36* (2013.01); *G06K 9/00536* (2013.01); *G06N 99/005* (2013.01)

(58) Field of Classification Search
  CPC .......... G11B 5/012; G11B 27/36; G11B 5/02; G11B 20/18; G11B 25/043; G11B 33/08; G11B 2220/20; G11B 2220/2537; G11B 20/1883; G11B 20/1816
  USPC ....... 360/25, 31, 53, 97.12; 369/53.1, 53.17, 369/53.42
  See application file for complete search history.

(56) References Cited

U.S. PATENT DOCUMENTS

| 5,465,308 | A | 11/1995 | Hutcheson et al. |
| 5,544,256 | A | 8/1996 | Breacher et al. |
| 7,359,544 | B2 * | 4/2008 | Gao ............ G06K 9/6253 382/145 |
| 8,698,492 | B1 | 4/2014 | Mak et al. |
| 9,135,103 | B2 | 9/2015 | Huang et al. |

OTHER PUBLICATIONS

Daniel Toth et al., "A two-stage-classifier for defect classification in optical media inspection",. IEEE Pattern Recognition. 2002., 4 pages.
Megan Guise et al., "Automated Defect Pattern Recognition: An Approach to Defect Classification and Lot Characterization", 2002 IEEE Systems and Information Design Symposium, 6 pages.
Zhi Sheng Chow et al., "Automated Visual Inspection System for Mass Production of Hard Disk Drive Media", International Symposium on Robotics and Intelligent Sensors 2012, 8 pages.
(Continued)

*Primary Examiner* — Nabil Hindi
(74) *Attorney, Agent, or Firm* — Westman, Champlin & Koehler, P.A.

(57) ABSTRACT

A method includes generating synthetic data related to known defect patterns on surfaces of magnetic media using parameterized rules. A classifier model is trained with the synthetic data so that the classifier model learns how to detect and identify defect patterns on magnetic media. Performance of the classifier model is validated by using real defect pattern data. The classifier model is deployed for use in identifying defective data patterns on magnetic media test specimens. The classifier may be used before or after clustering defect data points on surfaces of magnetic media.

20 Claims, 7 Drawing Sheets

(56) References Cited

OTHER PUBLICATIONS

Is. Liangwongsan et al., "Straight Line Defect Detection with Feed Forward Neural Network", World Academy of Science, Engineering and Technology Journal of Mechanical, Aerospace, Industrial, Mechatronic and Manufacturing Engineering vol. 6, No. 9, 2012, 6 pages.

\* cited by examiner

RECOGNIZING AND IDENTIFYING DEFECT PATTERNS ON MAGNETIC MEDIA

BACKGROUND

During the manufacturing of magnetic media, surfaces of magnetic media are inspected for defect patterns. Certain patterns of defects can be associated with issues in the manufacturing line.

SUMMARY

A method includes generating synthetic data related to known defect patterns on surfaces of magnetic media using parameterized rules. A classifier model is trained with the synthetic data so that the classifier model learns how to detect and identify defect patterns on magnetic media. Performance of the classifier model is validated by using real defect pattern data. The classifier model is deployed for use in identifying defective patterns from data collected from magnetic media test specimens.

A computer-implemented method includes classifying defect patterns on a test specimen of magnetic media using a classifier model that is trained by synthetic data generated from parameterized rules related to known defect patterns so as to identify what defect patterns exist on the test specimen of magnetic media. Conflicting defect patterns that were identified during classification are resolved using a rule-based fusion model. The identified defect patterns are clustered to determine which defect points belong to which defect patterns on the test specimen of magnetic media.

A system of recognizing and identifying defect patterns on surfaces of magnetic media includes a user interface configured to provide controls to a user to select defect data files of magnetic media to be submitted for recognition and identification of defect patterns. A file processor is configured to load and divide the selected defect data files of magnetic media into surfaces for processing. A plurality of surface processors are configured to process the selected defect data files of magnetic media in parallel to increase the speed at which defect data is processed during manufacturing of magnetic media.

The above summary is not intended to describe each disclosed embodiment or every implementation of the present disclosure. The figures and the detailed description below more particularly exemplify illustrative embodiments.

DETAILED DESCRIPTION OF ILLUSTRATIVE EMBODIMENTS

Figure 1:
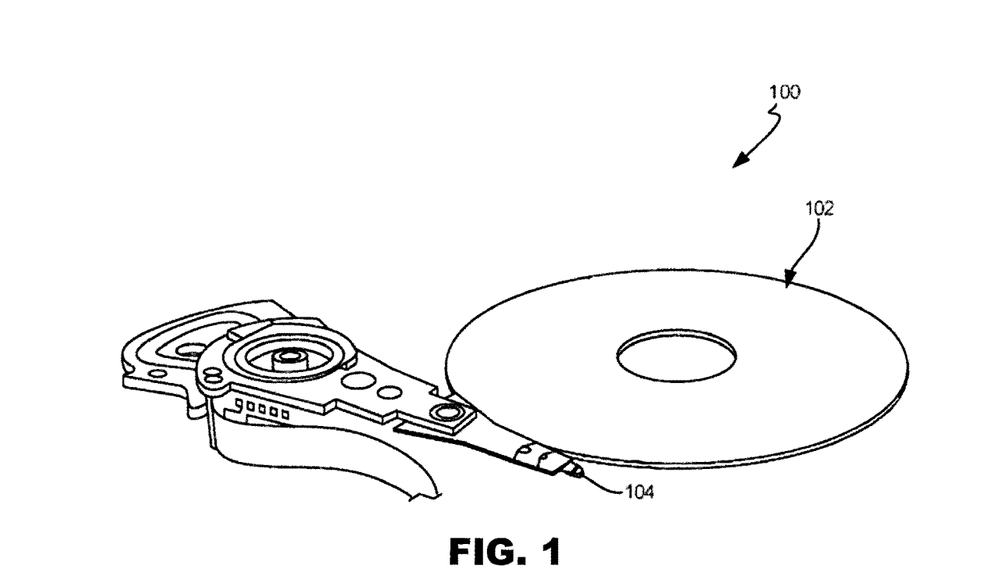
FIG. 1 illustrates a schematic illustration of a diagram showing a data storage device according to an embodiment.

FIG. 1 is a schematic illustration of a data storage device 100 including a data storage medium and a head for reading data from and/or writing data to the data storage medium. As shown in FIG. 1, the data storage device 100 includes a magnetic data storage medium or disc 102 and a head 104. The head 104 includes one or more transducer elements (not shown in FIG. 1) and is positioned above the data storage medium 102 to read data from and/or write data to the data storage medium 102. In the embodiment shown, the data storage medium 102 is a rotatable disc or other magnetic storage medium that includes a magnetic storage layer or layers.

This disclosure is related, in particular examples, to a method of analyzing surface defect patterns on magnetic media after different stages of manufacturing. During manufacture, defects on surfaces of magnetic media can occur. Identifying patterns of defects is essential in determining issues in the manufacturing line and deducing problems with machinery that are causing the defects. Clustering, where a cluster is an occurrence of either extremely similar or completely identical elements in close spatial proximity, is a method for identifying defect patterns on the surfaces of magnetic media and using the identified defect patterns to group elements together. Using clustering methods alone to analyze scanned magnetic media and generate labeled data is not only time consuming, but also not reliable due to the ever changing densities of magnetic media and the overlapping of defect patterns on the magnetic media. Therefore, the methods described herein utilize a combination of deep learning Convolutional Neural Network (CNN) and manual feature algorithms based on both actual, scanned and simulated data.

A CNN is used as a classifier model to learn how to classify defect patterns and actually determine what defect patterns or defect classes exist on a test specimen. Software algorithms are used to generate synthetic data so the CNN can be trained. The method enables higher accuracy and faster processing speeds. The resulting identified defect patterns notify users of issues in the manufacturing line based on the identified defect patterns. In addition, reductions in tooling maintenance costs and improvements in the quality of manufacture magnetic media are achieved.

Several measures (e.g., features), which transform raw data into defect pattern information, have been developed to detect and identify classes of defect patterns. These measures are used as inputs to classifier algorithms to aid in correctly detecting and identifying media defect patterns. Supervised learning approaches used in combination with classifier algorithms employ data from which to learn, so it is imperative to have enough varied data samples that can capture the general nature of defect patterns. For magnetic media, real defect data may be plentiful. However, the real defect data must be labeled with existing types of defect patterns. This task can be laborious given the thousands of samples that are employed in order for a classifier to learn parameters and can also be error prone. In addition, such labeling of defect patterns from real data may render the classifier ill equipped to handle new defect patterns that will inevitably arise in the future.

In embodiments of the disclosure, defective data samples of simulated disc surfaces are generated synthetically through a computer program according to parameterized rules and used for training a classifier model. For example, synthetically generated defect data or defect patterns can be generated through a software application, such as a software application written in the Python® computer language and can incorporate many Python® libraries, which are open-source packages for data science algorithms. Python® is a registered trademark owned by Python Software Foundation. It should be realized, however, that utilization of other similar libraries to Python® libraries are possible to achieve the same functionality. These data science algorithms are used with synthetic and real data to generate features and classifier models unique to the media defect pattern classification problem as well as provide a specialized user interface via web application when testing actual magnetic media being manufactured. The testing of and processing of magnetic media images of test specimens will be discussed in further detail below.

Each synthetically generated defect pattern has associated parameters describing how the patterns should be generated with random noise, defect points, locations, shape and other characteristics. For example, each synthetically generated defective data sample includes a number of defects, an area or areas where these defects are to be located, defect spreads and the radius or diameter where defects are located. Under one embodiment, in order to generate simulated defect data of synthetic discs with multiple defect patterns, a XML configuration file is used to describe all potential patterns and their associated parameters. Additional XML parameters are included to prescribe the number of synthetic discs with defects to create and the maximum number of defect patterns per synthetic disc. When initiated, the synthetic generation program reads the XML parameters, and then, randomly selects simulated defect patterns for each synthetic disc. The simulated defects for each synthetic disc are written to a file along with labels identifying the simulated defect patterns. These files are used in the training of classifier models having classifier algorithms. To verify the correct behavior of a classifier model trained with the synthetically generated discs having simulated defects, a smaller set of labeled real defect data is used to validate the classification performance. After validation, the trained classifier model is deployed for use in identifying defective data patterns on test specimens of magnetic media or discs.

Figure 2:
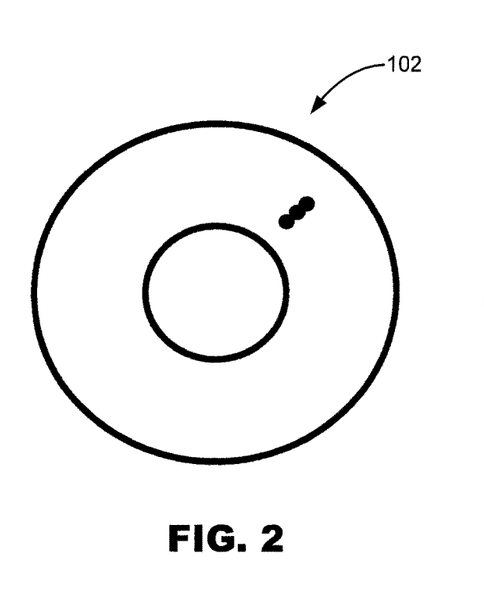
FIGS. 2-10 illustrate exemplary types of defect patterns or classes of defect patterns that can be found on surfaces of magnetic media according to an embodiment.
Figure 3:
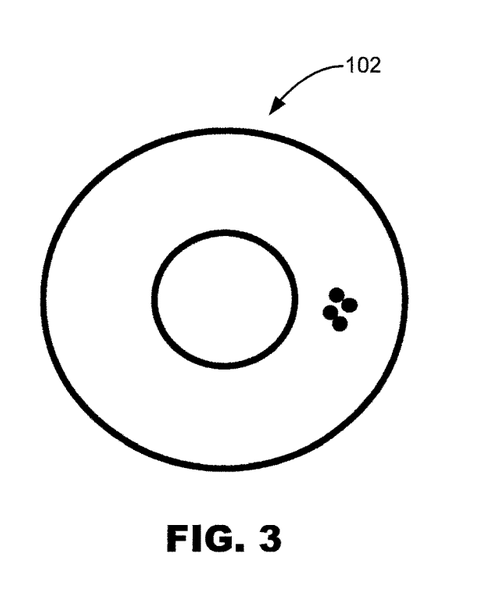
Figure 4:
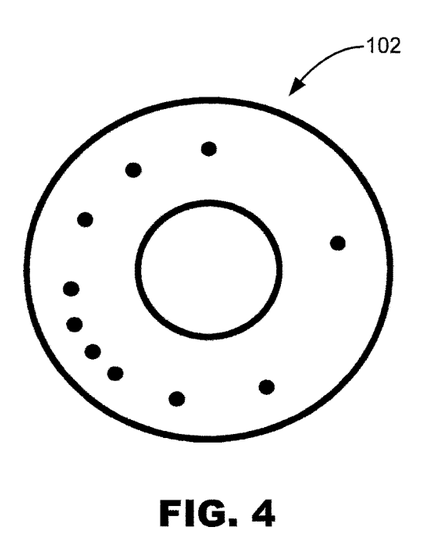
Figure 5:
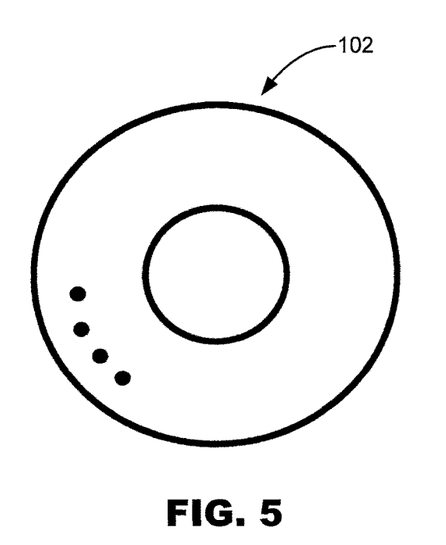
Figure 6:
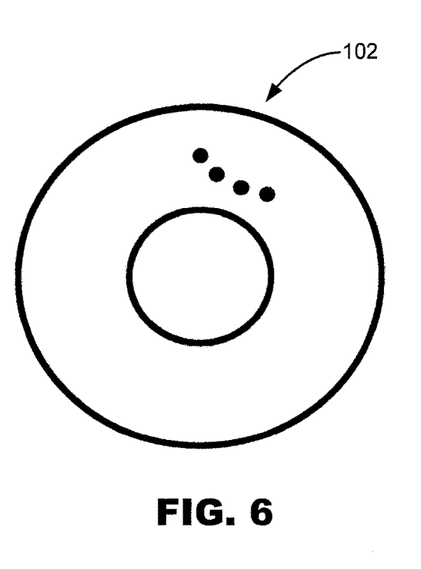
Figure 7:
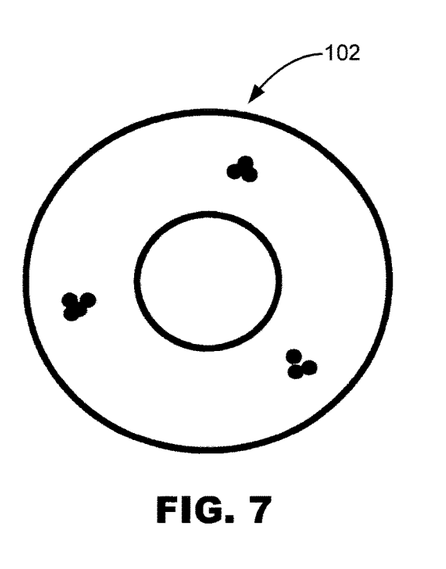
Figure 8:
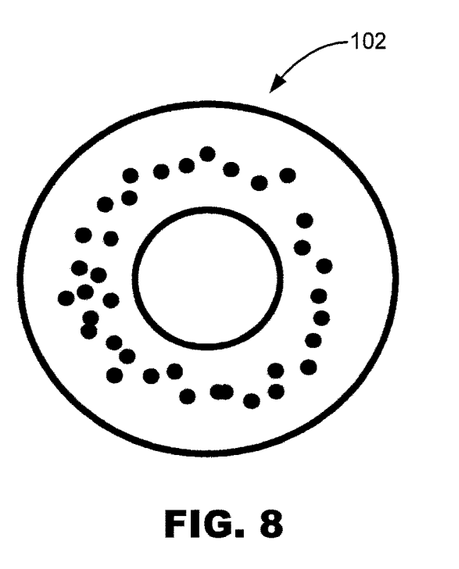
Figure 9:
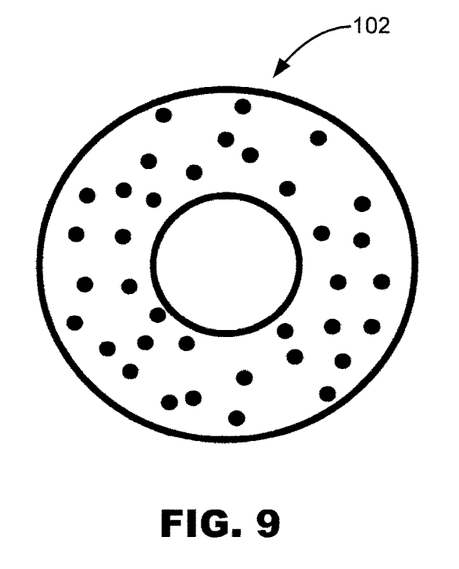
Figure 10:
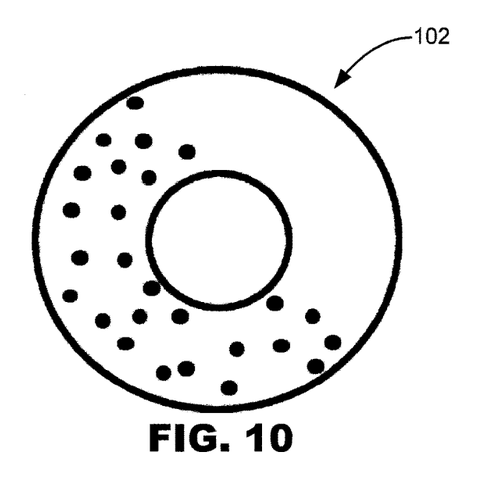

FIGS. 2-10 illustrate exemplary types of defect patterns or classes of defect patterns that can be found on surfaces of magnetic media or discs with defect points of each defect pattern being represented by black dots. Each defect pattern or class has its own set of special parameters or rules for generation in synthetic defect data samples. In FIG. 2, the example defect points are located on the surface of magnetic media 102 such that the defect points together form a defect pattern classified as a radial defect pattern. In FIG. 3, the example defect points are located on the surface of magnetic media 102 such that the defect points together form a defect pattern classified as a cluster defect pattern. In FIG. 4, the example defect points are located on the surface of magnetic media 102 such that the defect points together form a defect pattern classified as a long circumferential defect pattern of which can be further identified as being located at the inner diameter (ID), middle diameter (MD) or outer diameter (OD). In FIG. 5, the example defect points are located on the surface of magnetic media 102 such that the defect points together form a defect pattern classified as a short circumferential defect pattern of which can be further identified as being at the inner diameter (ID), middle diameter (MD) or outer diameter (OD). In FIG. 6, the example defect points are located on the surface of magnetic media 102 such that the defect points together form a defect pattern classified as a skew defect pattern. In FIG. 7, the example defect points are located on the surface of magnetic media 102 such that the defect points together from a defect pattern classified as a circumferential scratch defect pattern. In FIG. 8, the example defect points are located on the surface of magnetic media 102 such that the defect points together form a defect pattern classified as a band defect pattern. In FIG. 9, the example defect points are located on the surface of magnetic media 102 such that the defect points together form a defect pattern classified as a galaxy defect pattern, which can be further identified as being heavy, medium or light. In FIG. 10, the example defect points are located on the surface of magnetic media 102 such that the defect points together form a defect pattern classified as a half galaxy defect pattern.

Figure 11:
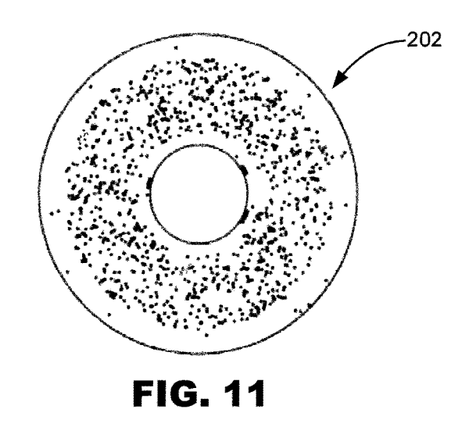
FIGS. 11-14 illustrate examples of synthetic data images of defective discs synthetically generated by a software application according to an embodiment.
Figure 12:
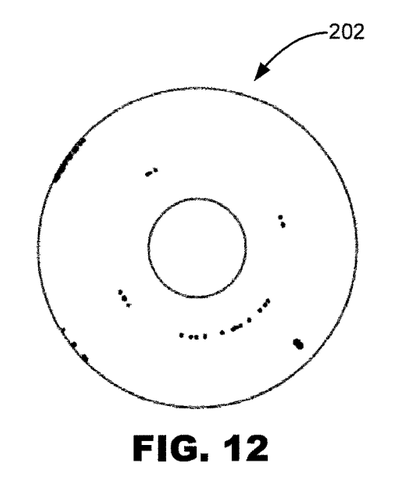
Figure 13:
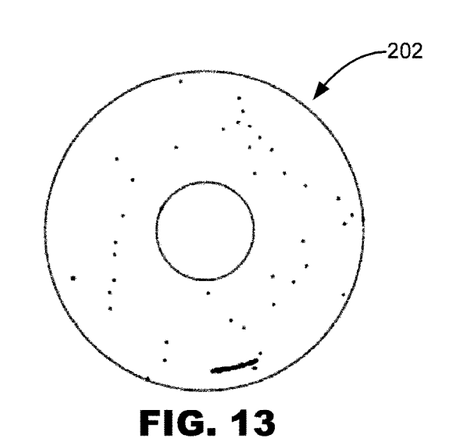
Figure 14:
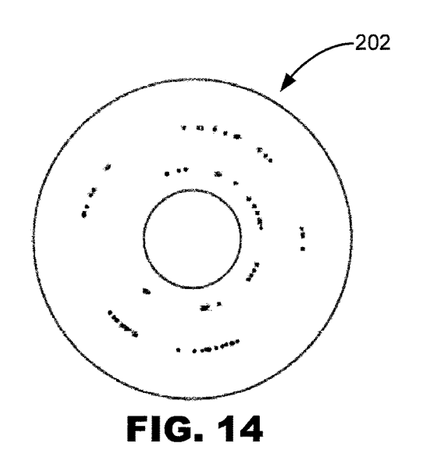

FIGS. 11-14 illustrate examples of simulated defective data synthetically generated by the described software application. Simulated defective discs that are synthetically generated as images can have one or more defect patterns and placement of those defective patterns can and should be different in order to provide a great many data samples to a classifier model for training. FIG. 11 illustrates a synthetic magnetic media image 202 including 976 total defects. The total number of defects form a cluster defect pattern, a skew defect pattern and a heavy galaxy defect pattern. FIG. 12 illustrates a synthetic magnetic media image 202 including 165 total defects. The total number of defects form a circumferential scratch defect pattern. FIG. 13 illustrates a synthetic magnetic media image 202 including 82 total defects. The total number of defects form a long circumferential defect pattern along the middle diameter and a light galaxy defect pattern. FIG. 14 illustrates a synthetic magnetic media image 202 including 80 total defects. The total number of defects form a long circumferential defect pattern along the inner diameter and a long circumferential defect pattern along the middle diameter.

Figure 15:
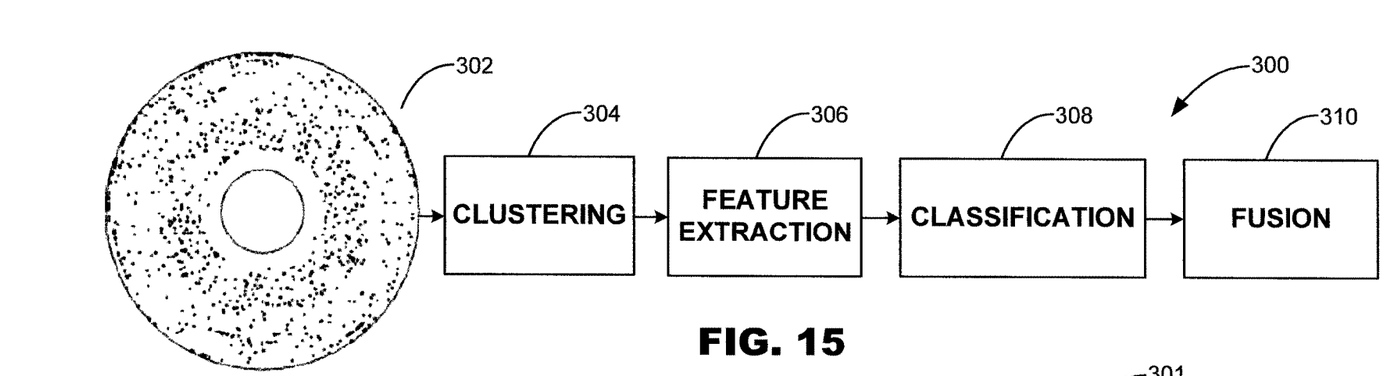
FIG. 15 illustrates a block diagram of a method of recognizing and identifying defect patterns on magnetic media according to one surface processing embodiment.
Figure 16:
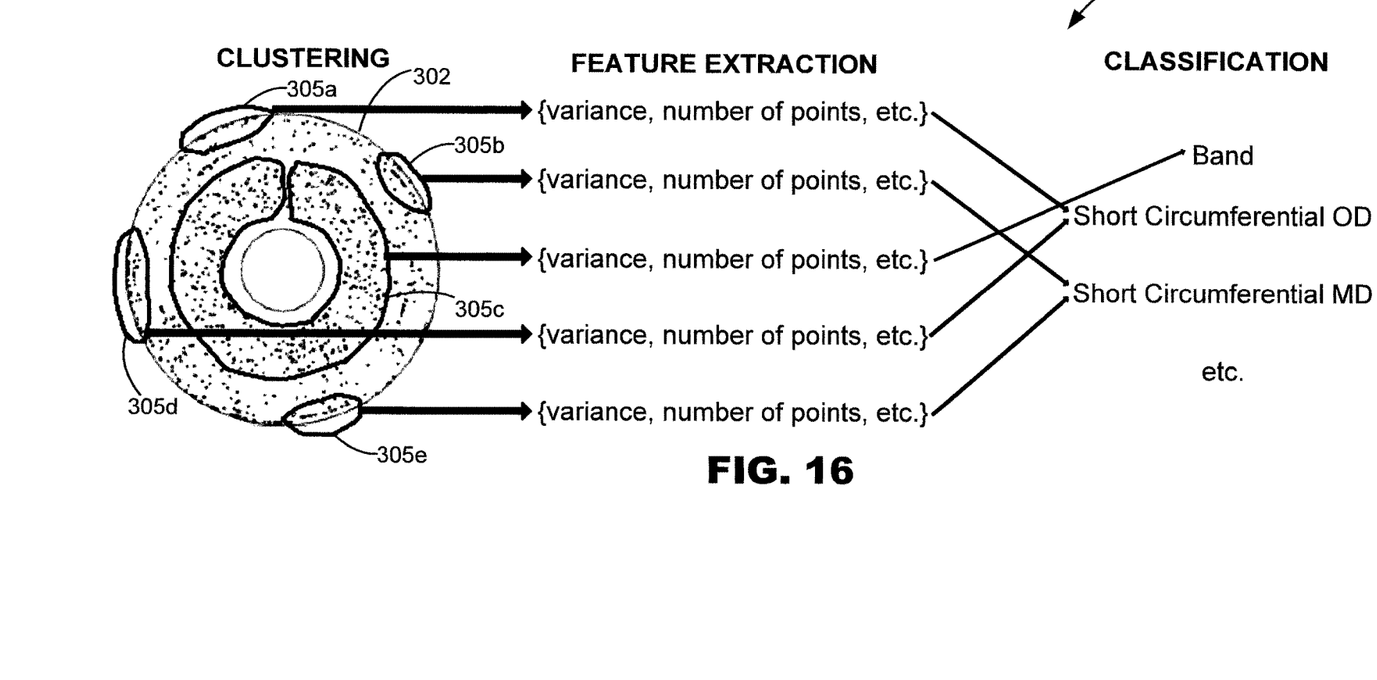
FIG. 16 illustrates a flow chart of the method illustrated in FIG. 15.

FIGS. 15 and 16 illustrate a block diagram 300 and a flow chart 301, respectively, illustrating a method of recognizing and identifying defect patterns on magnetic media according to one embodiment. In this embodiment, a traditional data science approach is used for surface processing where the user manually engineers features (e.g., mathematical expressions) from the preprocessed and clustered defect data. These features are then fed to a classifier algorithm that can either be constructed from expert experience or, in one embodiment, through automatic learning techniques, such as a CNN. This approach is called the "preprocess-cluster-feature extraction-classify" approach and is useful especially when there is not much training data available or for other reasons due to the particular magnetic media being processed.

At block 304, defect points on a preprocessed, scanned image 302 of a surface of magnetic media are clustered. An exemplary clustering algorithm may include DBSCAN (Density-based Scanning Clustering Algorithm) with unique distance and minimum core point parameter values. Other clustering methods are possible including clustering methods such as grouping defect points within sector and track regions on the disc. After clustering or grouping (as illustrated in FIG. 16 where clusters or groups are highlighted with circles 305) occurrences of either extremely similar or completely identical elements in close spatial proximity, the method moves on to block 306.

At block 306, features from the clusters or groups are extracted. For example, feature extraction methods can vary including extracting statistical measures (e.g., mean, variance, other statistical moments, entropy, defect counts or number of defect points, Fourier transform coefficients, etc.) At block 308, the extracted features are classified. For example, after the feature extraction of groupings or clusters 305a and 305d, it is determined that groupings or clusters 305a and 305d are classified as short circumferential defect patterns located at the outer diameter. Likewise, groupings or clusters 305b and 305e are classified as short circumferential defect patterns at the middle diameter. Further, grouping or cluster 305c is classified as a band defect pattern. Each type of defect patterns has a unique set of features (feature vector) that is used to detect and identify the defect pattern automatically using the classifier. Fuzzy logic, logistic regression and decision trees have been used as classifiers for this approach. The fuzzy logic and decision tree methods both have unique rules used to diagnose defect patterns, while logistic regression can be trained on limited labeled data to determine unique parameters for classification.

At block 310, conflicts between classifications are resolved using a fusion-based algorithm. For example, a magnetic media includes a defect pattern classified as a galaxy, however, a galaxy is composed of many clusters. Therefore, if there is a galaxy class, the fusion-based algorithm prevents the system from looking for clusters. Basically, the fusion-based algorithm prioritizes and make decisions where there is a conflict in different classifications.

Figure 17:
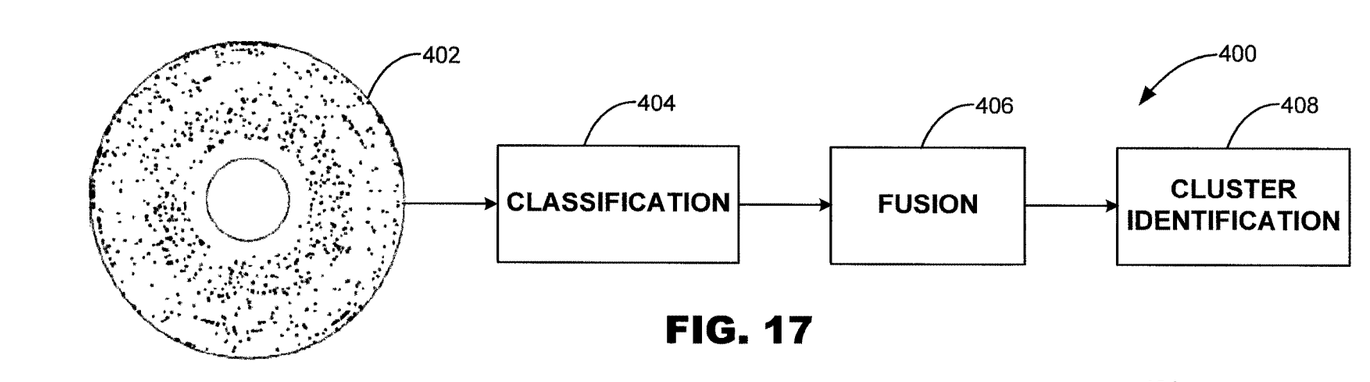
FIG. 17 illustrates a block diagram of a method of recognizing and identifying defect patterns on magnetic media according to another surface processing embodiment.
Figure 18:
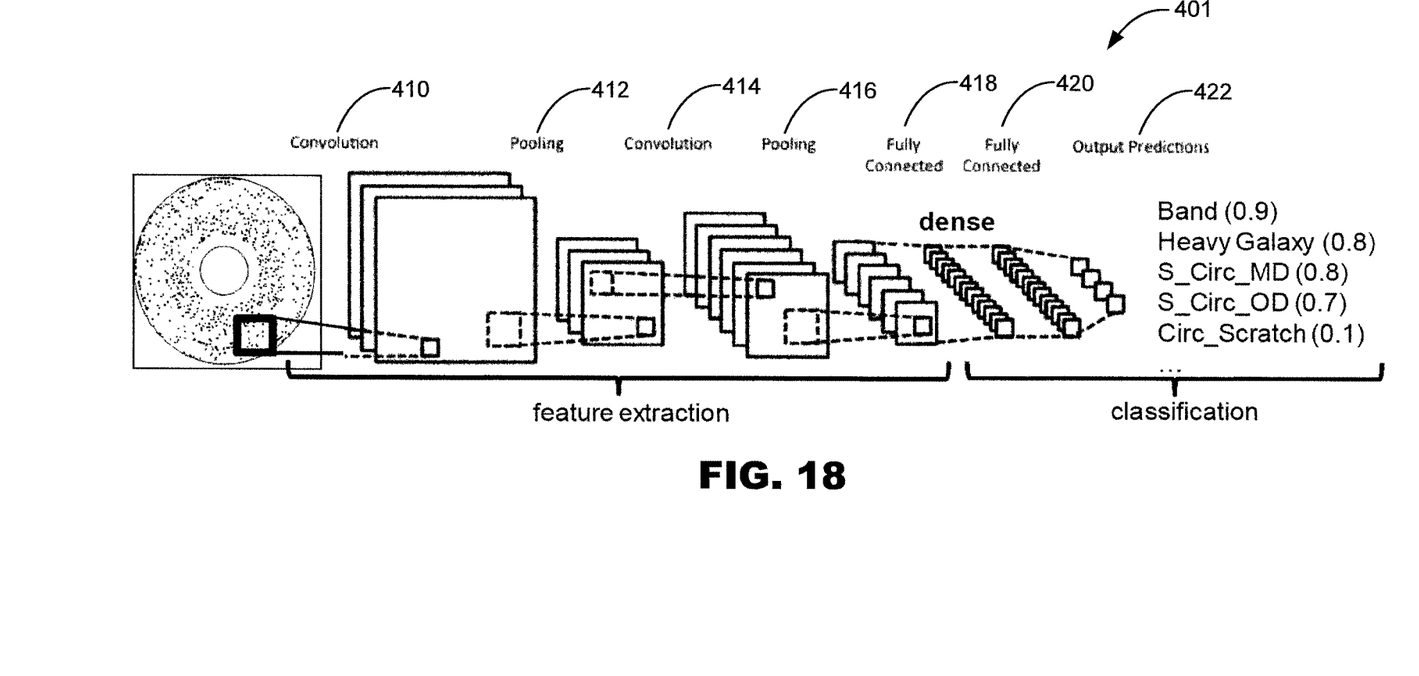
FIG. 18 illustrates a flow chart of the method illustrated in FIG. 17.

FIGS. 17 and 18 illustrate a block diagram 400 and a flow chart 401, respectively, illustrating a method of recognizing and identifying defect patterns of magnetic media according to an alternative embodiment. In this surface processing embodiment, the clustering or grouping of defect points occurs after classification. In other words, the clustering of defect patterns is based on classifier results rather than vice versa and relies on training of data to automatically engineer features for the purposes of detecting and identifying defect patterns. This approach is called the "preprocess-classify-cluster" approach. This alternative method better handles issues related to defect points that cannot easily be separated into groups because of varying densities, noise, or other complex occurrences are addressed. By generating synthetic data where as much data as necessary can be created on demand, the large amount of data that is needed for classifying has been addressed. In addition, since some of the defect patterns may overlap or conflict with one another, a fusion ruled-based algorithm is used for resolution. Basically, once the candidate defect patterns have been classified or that a defect pattern has been identified from an image of a surface of magnetic media, the clustering algorithm, which is often a CNN implementation for image segmentation of selected defect patterns, then focuses on clustering the data into specialized shapes of interest.

At block 404, data points on a preprocessed scanned image 402 of a surface of a magnetic media under test are classified using a classifier. FIG. 18 illustrates a flow chart 401 of the step of classification when classification occurs before clustering and is performed by convolutional neural networks that have various layer structures specific to the application that are developed through analysis/experimentation. In particular and in accordance with the CNN described herein, the CNN is trained using the synthetically generated data described above with a supervised learning approach through a Python® library. The input to classifier 404 is an image showing defect points and the outputs are identified or labeled indicators of defect pattern types from the image showing defect points.

The CNN includes multiple layers and steps of computations that are categorized as feature extraction computations and then classification computations as illustrated in FIG. 18. To begin with, a convolutional computation or layer 410 is performed. Convolution is the step of learning the filters to enhance and/or diminish pixel values. After convolution, an operation of pooling 412 occurs, which downsamples the image or reduces the resolution of the image. Then convolution 414 again and pooling 416. In other words, several computations are performed that do something to the image preceding it and create new images after it. Sometimes the images get smaller in size or larger, sometimes pixels of the image are enhanced and sometimes pixels of the image are de-enhanced. In other words, enhanced pixels show defects that fit a particular defect pattern and de-enhanced pixels show portions of the disc that do not fit a particular defect pattern. In other embodiments, several convolutions can take place in a row followed by one pooling operation. The number and amount and combination of convolution and pooling layers or operations is not set, but is determined depending upon the image being analyzed. After convolution and pooling, the method includes the steps of flattening 418 and connecting densities 420, which entails converting image outputs from layers to a 1-D vector of pixel values and classifying the flattened 1-D vector. At step 422, an output of identified or labeled indicators of defect pattern types are given. (deduce problems in machinery)

At block 406, conflicts between classifications are resolved using a fusion-based algorithm. For example, a magnetic media includes a defect pattern classified as a galaxy, however, a galaxy is composed of many clusters. Therefore, if there is a galaxy class, the fusion-based algorithm prevents the system from looking for clusters. Basically, the fusion-based algorithm prioritizes and makes decisions where there is a conflict in different classifications.

After it is determined from blocks 404 and 406 what is on the magnetic media or which class or classes of defect patterns the magnetic media belongs to or includes, it is still unknown which of the defect points on the magnetic media belong to which class or classes of an identified defect pattern or where those defect points are located. To determine where the defect points are located, at block 408, the defect points are clustered. For example, one way to cluster is by image segmentation, which identifies regions on the disc that belong to certain classes. Another option is to use traditional clustering techniques. In the embodiment described in FIGS. 17 and 18 where defect patterns are identified first, the clustering algorithm can be tuned or focused to finding the defect points in that particular defect pattern class.

Figure 19:
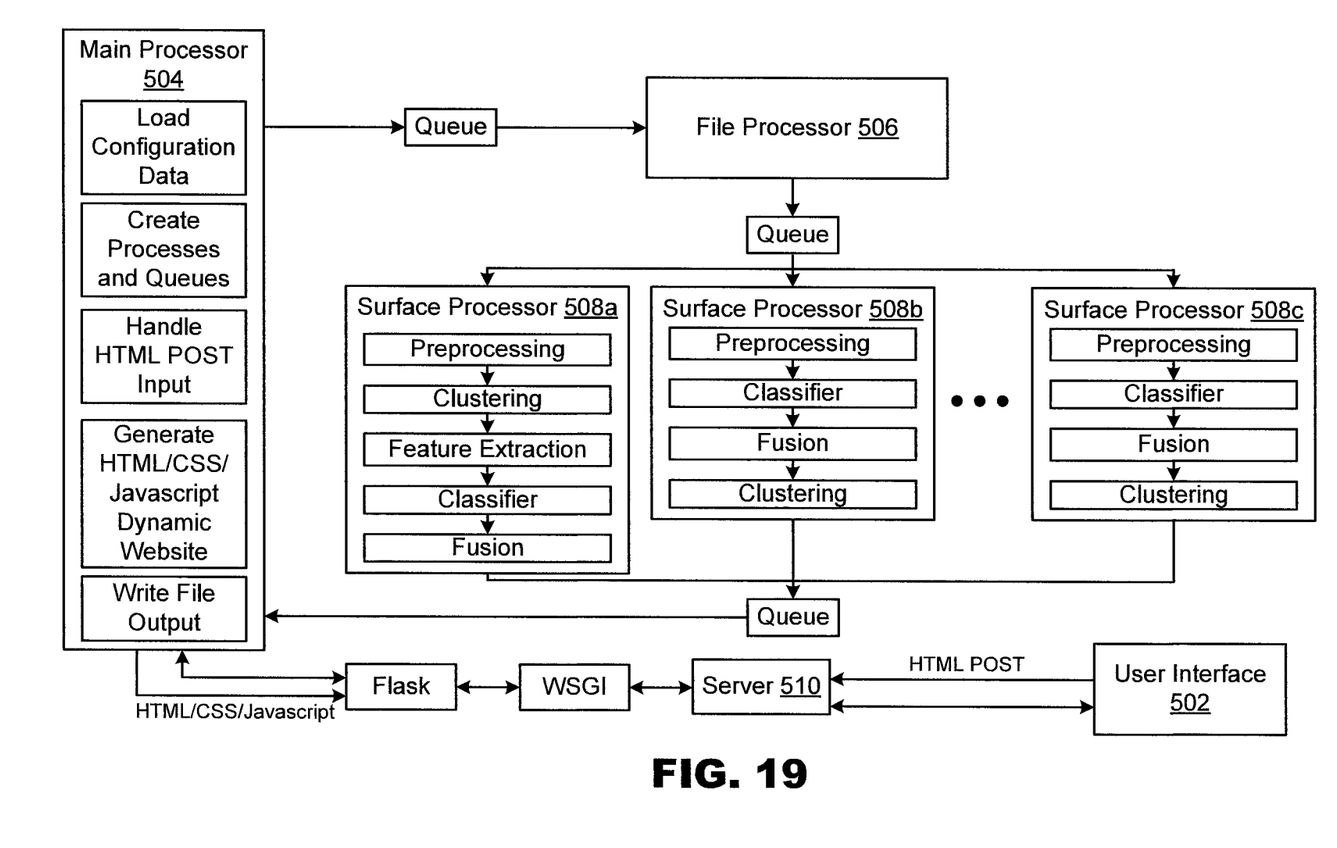
FIG. 19 illustrates a system for recognizing and identifying defect patterns on magnetic media according to one embodiment.

FIG. 19 illustrates a block diagram of a system 500 for implementing the methods described in FIGS. 15 and 16 and FIGS. 17 and 18. System 500 illustrates a hybrid system that employs both surface processors that use the "preprocess-cluster-feature extraction-classify" surface processing approach of FIGS. 15 and 16 and the "preprocess-classify-cluster" surface processing approach of FIGS. 17 and 18. As illustrated in FIG. 19, surface processor 508a is a surface processor that employs the "preprocess-cluster-feature extraction-classify" approach, while surface processors 508b and 508c are surface processors that employ the "preprocess-classify-cluster" approach. While FIG. 19 illustrates these different types of surface processors being implemented or integrated into system 500, it is possible that system 500 may use only one of the surface processing approaches and not both.

System 500 includes a user interface 502, a main processor 504, a file processor 506 and a plurality of surface processors 508*a*, 508*b* and 508*c*. In one embodiment, user interface 502 is a web application written, for example, in HTML, CSS and JavaScript programming languages, and is accessible by a user from a client device, such as a client computing device. User interface 502 provides controls that allow the user to select the defect data files of surfaces of magnetic media to process for the recognition of and identification of defect patterns. For example, the user can select to upload files to a server 510, select product type and data ranges for files on a remote storage device (not illustrated in FIG. 19) or select serial numbers of magnetic discs. In one embodiment, WSGI (web server gateway interface) 512 and a flask 514 are employed to aid server 510 (when it is a web server) in communicating with web applications to process a request.

Once the desired files are submitted for processing, several independent software processes are created. In one process, configuration data is loaded by a main processor 504. For example, the user is allowed to set, as a configuration parameter, the number parallel surface processors or surface processing engines 508 to create. Since computation speed is desired in manufacturing of magnetic media, multiprocessing of surfaces is integrated into system 500. In another process, defect data is loaded from selected discs in files to a file processor 506, which loads and divides file data into surfaces, and is sent to surface processors 508. Surface processors 508 then compute results in parallel. In addition, main processor 504 also generates and displays results in the form of a web application for web browser display on the client computer and creates output detail and summary data fields when surface processing requests have been completed. The incorporation of these multiple processes allow multiple CPU cores to be utilizes, increasing the speed at which defect data is processed using the concept of data parallelism where the same processing task is used on different data at the same time. The pattern result of each surface of the recording media is stored in a database (not shown) with the corresponding sample identification. With a common database storage, this enables coherent linking of pattern data with the other disc drive parametric and attribute information.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments and can be used to solve other problems of similar nature such as image analysis in astronomy, optometry, compact discs/DVD and semiconductor wafers, etc. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method comprising:
    generating synthetic data related to known defect patterns on surfaces of magnetic media using parameterized rules;
    training a classifier model with the synthetic data so that the classifier model learns how to detect and identify defect patterns on magnetic media;
    validating performance of the classifier model by using real detect pattern data; and
    deploying the classifier model for use in identifying defective patterns from data collected from magnetic media test specimens.

2. The method of claim 1, wherein the classifier model comprises a convolutional neural network (CNN).

3. The method of claim 1, wherein the synthetic data comprises simulated images of surfaces of magnetic media having defect data patterns.

4. The method of claim 3, wherein generating the synthetic data comprises randomly selecting simulated defect patterns for each simulated image of magnetic media.

5. The method of claim 4, wherein the defects for each simulated image of magnetic media is written to a file along with labels identifying the simulated defect patterns.

6. The method of claim 5, wherein each file is used in training the classifier model.

7. A computer-implemented method comprising:
    classifying defect patterns on a test specimen of magnetic media using a classifier model that is trained by synthetic data generated from parameterized rules related to known defect patterns so as to identify what defect patterns exist on the test specimen of magnetic media;
    resolving conflicting defect patterns that were identified during classification using a rule-based fusion model; and
    clustering the identified defect patterns to determine which defect points belong to which defect patterns on the test specimen of magnetic media.

8. The method of claim 7, wherein the classifier model comprises a convolutional neural network (CNN).

9. The method of claim 7, wherein the test specimen comprises an image of a surface of magnetic media.

10. The method of claim 9, wherein classifying defect patterns on the image of the surface of magnetic media comprises performing one or more consecutive convolutional computations of enhancing or de-enhancing pixels on the image.

11. The method of claim 10, wherein classifying defect patterns on the image of the surface of magnetic media comprising performing an operation of pooling after one or more convolutional computations in order to reduce the resolution of the image.

12. The method of claim 11, wherein after the operations of convolution and pooling are complete, the image is flattened and further classified or labeled with defect pattern types.

13. A system of recognizing and identifying defect patterns on surfaces of magnetic media, the system comprising:
- a user interface configured to provide controls to a user to select defect data files of magnetic media to be submitted for recognition and identification of defect patterns;
- a file processor configured to load and divide the selected defect data files of magnetic media into surfaces for processing;
- a plurality of surface processors configured to process the selected defect data files of magnetic media in parallel to increase the speed at which defect data is processed during manufacturing of magnetic media.

14. The system of claim 13, further comprising a main processor that generates and displays detailed results and summary data fields when surface processing is completed.

15. The system of claim 13, further comprising a main processor that loads configuration data to configure the plurality of surface processors.

16. The system of claim 15, wherein the user provides the configuration data loaded by the main processor, the configuration data comprising setting a number of parallel surface processors that are to be used.

17. The system of claim 13, wherein at least one of the surface processors comprises an engine that classifies defective data on the surface of magnetic media into defect patterns before clustering defect points on the surface of the magnetic media.

18. The system of claim 13, wherein at least one of the surface processors comprises an engine that clusters defect points on the surface of the magnetic media before classifying the defective data on the surface of magnetic media into defect patterns.

19. The system of claim 13, wherein the plurality of surface processors comprise a hybrid of surface processors where at least one of the surface processors comprises an engine that classifies defective data on the surface of magnetic media into defect patterns before clustering defect points on the surface of the magnetic media and at least one of the surface processors comprises an engine that clusters defect points on the surface of the magnetic media before classifying the defective data on the surface of magnetic media into defect patterns.

20. The system of claim 13, wherein when the user interface submits select defect data files of magnetic media for recognition and identification of defect patterns the user interface uploads the select defect data files to a web server.

* * * * *